United States Patent
Nakatsuka

(10) Patent No.: US 8,659,061 B2
(45) Date of Patent: Feb. 25, 2014

(54) SOLID-STATE IMAGE CAPTURING ELEMENT

(75) Inventor: Keisuke Nakatsuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/611,854

(22) Filed: Sep. 12, 2012

(65) Prior Publication Data

US 2013/0240961 A1     Sep. 19, 2013

(30) Foreign Application Priority Data

Jan. 6, 2012 (JP) ................ P2012-001115

(51) Int. Cl.
*H01L 31/062*     (2012.01)
(52) U.S. Cl.
USPC ........... 257/292; 257/290; 257/225; 257/444; 257/E27.133
(58) Field of Classification Search
USPC ............... 257/225, 444, E27.133, 272, 270
IPC .................................... H01L 27/14603
See application file for complete search history.

(56) References Cited

U.S. PATENT DOCUMENTS

| | | | |
|---|---|---|---|
| 5,043,946 A | 8/1991 | Yamauchi et al. | |
| 5,075,888 A | 12/1991 | Yamauchi et al. | |
| 5,140,552 A | 8/1992 | Yamauchi et al. | |
| 6,091,449 A | 7/2000 | Matsunaga et al. | |
| 6,816,198 B1 | 11/2004 | Suzuki | |
| 2010/0053386 A1 | 3/2010 | Sizukuisi | |

FOREIGN PATENT DOCUMENTS

| | | |
|---|---|---|
| JP | 2-7478 | 1/1990 |
| JP | 2556885 | 9/1996 |
| JP | 3668651 | 4/2005 |
| JP | 2010-80953 | 4/2010 |
| WO | WO 97/07630 | 2/1997 |

*Primary Examiner* — Eva Yan Montalvo
(74) *Attorney, Agent, or Firm* — Oblon, Spivak, McClelland, Maier & Neustadt, L.L.P.

(57) ABSTRACT

In one embodiment, a solid-state image capturing element of an embodiment has: a semiconductor substrate; a photodiode formed on the semiconductor substrate; a capacitor formed on the semiconductor substrate and including a first electrode layer, an insulating layer, and a second electrode layer which are stacked in sequence; a transistor formed on the semiconductor substrate and including a floating gate and a control gate; and a first electrode portion electrically connecting the second electrode layer and an n-type diffusion layer or a p-type diffusion layer constituting the photodiode. Further, the first electrode layer of the capacitor is constituted by the floating gate of the transistor, and the second electrode layer of the capacitor and the control gate of the transistor are discontinuous.

6 Claims, 4 Drawing Sheets

SOLID-STATE IMAGE CAPTURING ELEMENT

CROSS-REFERENCE TO RELATED APPLICATION

This application is based upon and claims the benefit of priority from the prior Japanese Patent Application No. 2012-001115, filed on Jan. 6, 2012; the entire contents of which are incorporated herein by reference.

FIELD

Embodiments described herein relate generally to a solid-state image capturing element.

BACKGROUND

For capturing an image, a solid-state image capturing element such as a CCD image sensor has been conventionally used. Further, for displaying an image, display devices such as a CRT, a liquid crystal display panel, and a plasma display panel have been conventionally used. When image data (electric signal) converted from an image signal (optical signal) by the solid-state image capturing element is, for example, processed or transmitted, the image data is required to be accumulated in a memory. Therefore, in an image processing as described above, a storage element (memory) for storing an electric signal related to an image is necessary in addition to the solid-state image capturing element.

In order to cope with such a request, there is disclosed a technique to form a volatile memory element constituted by a photodiode, a capacitor element, and a MOS-type transistor, and a non-volatile memory element on a semiconductor substrate. After an optical signal received by the photodiode is converted into an electric signal in the volatile memory element, the electric signal is stored in a non-volatile memory.

However, in order to store the electric signal in the non-volatile memory, it is necessary to apply a voltage to a terminal of the volatile memory element to inject an electric charge as the electric signal stored in the non-volatile memory into the volatile memory element. In other words, when the electric signal is to be stored (written) in the memory, an external voltage is required to be applied. Not only a writing operation is complicated, but also an external electric source is additionally necessary for the purpose of writing.

Further, there is disclosed a technique in which a photodiode and a non-volatile memory are formed on a semiconductor substrate and an electron is injected into a floating gate of the non-volatile memory in advance and a negative voltage is applied to a control gate of the non-volatile memory. By supplying a positive electric charge originated in an electric signal converted from an optical signal in the photodiode to pull the electron out of the floating gate, the electric signal is stored in a non-volatile memory element.

However, also in this case, in order to store (write) the electric signal in the non-volatile memory, a negative voltage is required to be applied to a control gate of the non-volatile memory. Not only a writing operation is complicated, but also an external electric source is additionally necessary for the purpose of writing.

DETAILED DESCRIPTION

A solid-state image capturing element of an embodiment has: a semiconductor substrate; a photodiode formed on the semiconductor substrate; a capacitor formed on the semiconductor substrate and including a first electrode layer, an insulating layer, and a second electrode layer which are stacked in sequence; a transistor formed on the semiconductor substrate and including a floating gate and a control gate; and a first electrode portion electrically connecting the second electrode layer and an n-type diffusion layer or a p-type diffusion layer constituting the photodiode. Further, the first electrode layer of the capacitor is constituted by the floating gate of the transistor, and the second electrode layer of the capacitor and the control gate of the transistor are discontinuous.

(Configuration of Solid-state Image Capturing Element)

Figure 1:
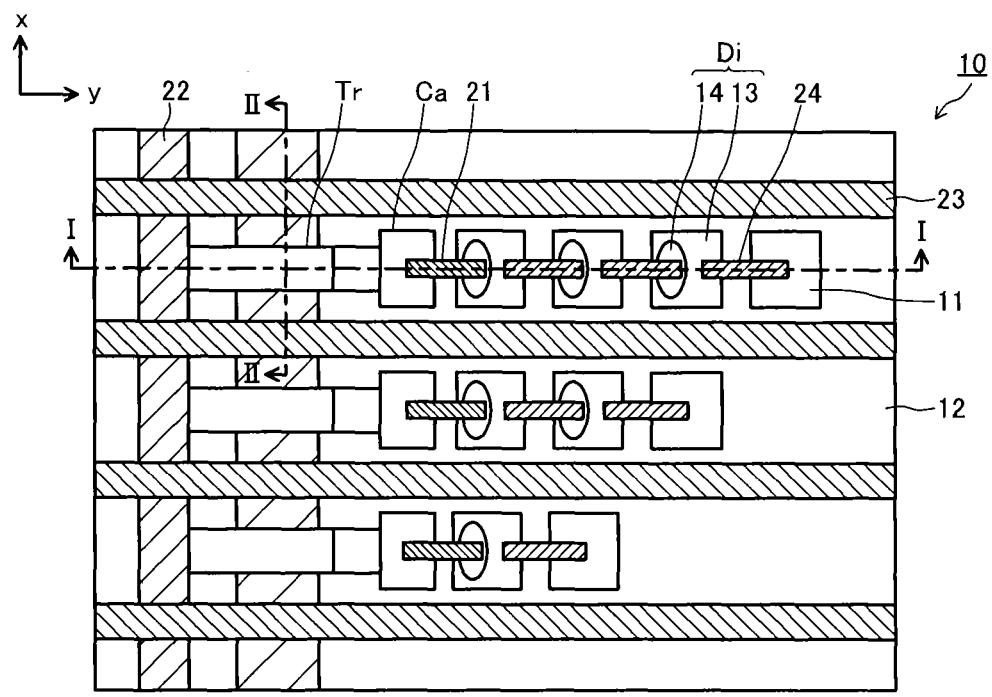
FIG. 1 is a plan view showing a region for one pixel of a solid-state image capturing element in an embodiment.
Figure 2:
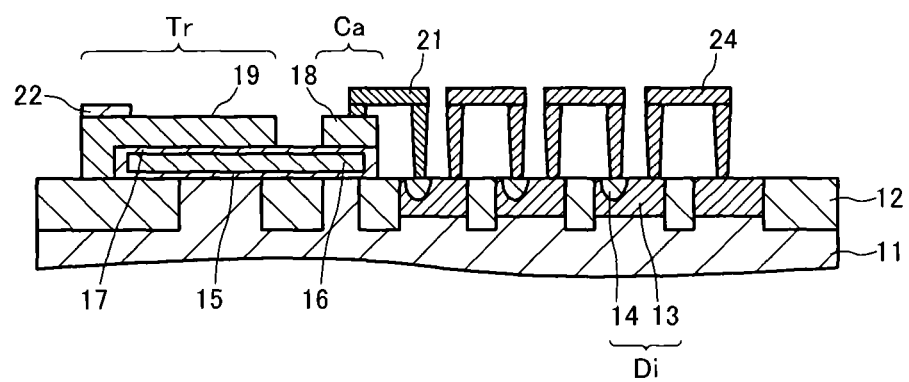
FIG. 2 is a cross-section view of the solid-state image capturing element shown in FIG. 1 taken along a line I-I.
Figure 3:
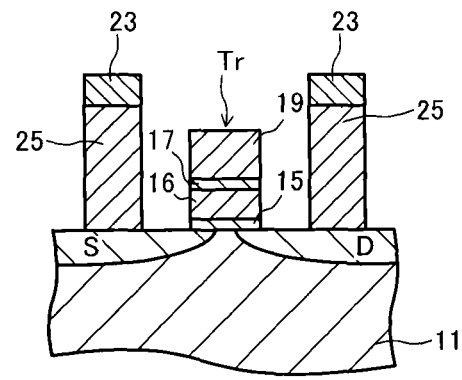
FIG. 3 is a cross-sectional view of the solid-state image capturing element shown in FIG. 1 taken along a line II-II.

FIG. 1 to FIG. 3 are diagrams showing a schematic configuration of the solid-state image capturing element of this embodiment. FIG. 1 is a plan view showing a region for one pixel of the solid-state image capturing element in this embodiment, FIG. 2 is a cross-sectional view of the solid-state image capturing element shown in FIG. 1 taken along a line I-I, and FIG. 3 is a cross-sectional view of the solid-state image capturing element shown in FIG. 1 taken along a line II-II.

As shown in FIG. 1 and FIG. 2, a solid-state image capturing element 10 of this embodiment has an n-type silicon substrate 11, a p-type diffusion layer 13 formed in a surface of the n-type silicon substrate 11, and an n-type diffusion layer 14 formed inside the p-type diffusion layer 13. As a result that the p-type diffusion layer 13 and the n-type diffusion layer 14 are pn-joined, a photodiode element Di is constituted. Note that, though not shown, when a p-type silicon substrate is used, an n-type diffusion layer is formed in its surface and a p-type diffusion layer is formed inside the n-type diffusion layer. A photodiode similar to the above can be formed.

Further, on the n-type silicon substrate 11, a floating gate 16 made up of n-type polysilicon or the like is formed via a first insulating film 15 made up of silicon oxide, for example. Further on the floating gate 16 are discontinuously formed an electrode layer 18 and a control gate 19 made up of n-type polysilicon or the like via a second insulating film 17 made up of silicon oxide, for example.

The floating gate 16 extends to below the electrode layer 18 and functions as a counter electrode layer to the electrode layer 18. Therefore, the floating gate 16, the second insulating film 17, and the electrode layer 18 constitute a capacitor element Ca. Further, the floating gate 16, the second insulating film 17, and the control gate 19 constitute a transistor element Tr.

Note that the electrode layer 18 of the capacitor element Ca and the control gate 19 of the transistor element Tr are separated to be discontinuous for the purpose of realizing writing of an electric signal in the capacitor element Ca, as will be described below.

Further, as shown in FIG. 1, in the solid-state image capturing element 10 of this embodiment, three transistor elements Tr are arrayed in a first direction (x direction) of the n-type silicon substrate 11. Three capacitor elements Ca are arrayed also in the first direction (x direction) in a manner to correspond to the three transistor elements Tr.

Further, as shown in FIG. 1, in the solid-state image capturing element 1 of this embodiment, a plurality of the above-described photodiode elements Di is provided in a manner to be electrically connected to the respective capacitor elements Ca. Concretely, in a first row in the first direction (x direction) of the n-type silicon substrate 11, a single photodiode element Di is arranged in a manner to be electrically connected to the capacitor element Ca. In a second row in the first direction (x direction), two photodiode elements Di connected in series via an electrode member 24 are electrically connected to the capacitor element Ca in a second direction (y direction) orthogonal to the first direction (x direction) of the n-type silicon substrate 11. Ina third row in the first direction (x direction), three photodiode elements Di connected in series via the electrode members 24 are electrically connected to the capacitor element Ca in the second direction (y direction) orthogonal to the first direction (x direction) of the n-type silicon substrate 11.

Note that in the first row to the third row, electric connection between the photodiode element Di and the capacitor element Ca is performed by connecting the n-type diffusion layer 14 of the photodiode element Di closest to the capacitor element Ca and the electrode layer 18 of the capacitor element Ca by a first electrode portion 21. However, when the p-type silicon substrate is used instead of the n-type silicon substrate as described above, the electrode layer 18 of the capacitor element Ca is electrically connected to the p-type diffusion layer formed inside the n-type diffusion layer and the first electrode section 21. The first electrode portion 21 functions as a writing electrode into the capacitor element Ca, as will be described below.

The electric connection between each capacitor element Ca and photodiode elements Di is shown in detail in FIG. 2, for a connection mode in the third row in particular. Note that with regard to the other arrangements, the above-described electric connection is similar to that shown in FIG. 2, only the number of the photodiode elements Di being different.

The above-described three transistor elements Tr, three capacitor elements Ca, and photodiode elements Di totaling to six are element-isolated from each other by STI (Shallow Trench Isolation) 12 formed in the surface of then-type silicon substrate 11.

The three transistor elements Tr arrayed in the first direction (x direction) of the n-type silicon substrate 11 are electrically connected by a second electrode 22 disposed along the first direction (x direction). Concretely, the control gate 19 of the transistor element Tr and the second electrode 22 are electrically connected, and thereby the three transistor elements Tr are electrically connected.

Further, in the second direction (y direction) orthogonal to the first direction (x direction) of the n-type silicon substrate 11, third electrode portions 23 electrically connected to the second electrode 22 are disposed. Contacts (plugs) 25 are provided below the third electrode portions 23. The third electrode portions 23 are electrically connected to a source S and a drain D of the transistor element Tr via the contacts (plugs) 25. Note that, as will be described below, the second electrode portion 22 functions as a reading/deleting electrode from the capacitor element Ca, while the third electrode portion 23 functions as a reading electrode from the capacitor element Ca.

In this embodiment, one pixel constituting the solid-state picture capturing element 10 is constituted by the three transistor elements Tr and the three capacitor elements Ca. In the arrays (three arrays in total) in the first direction (x direction) defined by the respective transistor elements Tr and the respective capacitor elements Ca, one to three photodiodes Di are arrayed in series. However, the number of the transistor elements Tr and the capacitor elements Ca disposed in one pixel is not limited to three, but can be an arbitrary number according to need.

Further, the number of the photodiode elements Di is changed from one to three for each array. However, the number of the photodiode elements Di disposed in each array is not limited to one to three, but can be an arbitrary number according to need.

It is possible to increase the numbers of the transistor elements Tr and the capacitor elements Ca and, in correspondence therewith, to change the number of the photodiode elements Di disposed in each array in a large range. Sensitivity of the solid-state image capturing element 10 to an optical signal (image signal) can be improved. However, in this embodiment, it is possible to use a single transistor element Tr and a single capacitor element Ca and to dispose a predetermined number of photodiode elements Di in a manner to be electrically connected to the capacitor element Ca.

Figure 4:
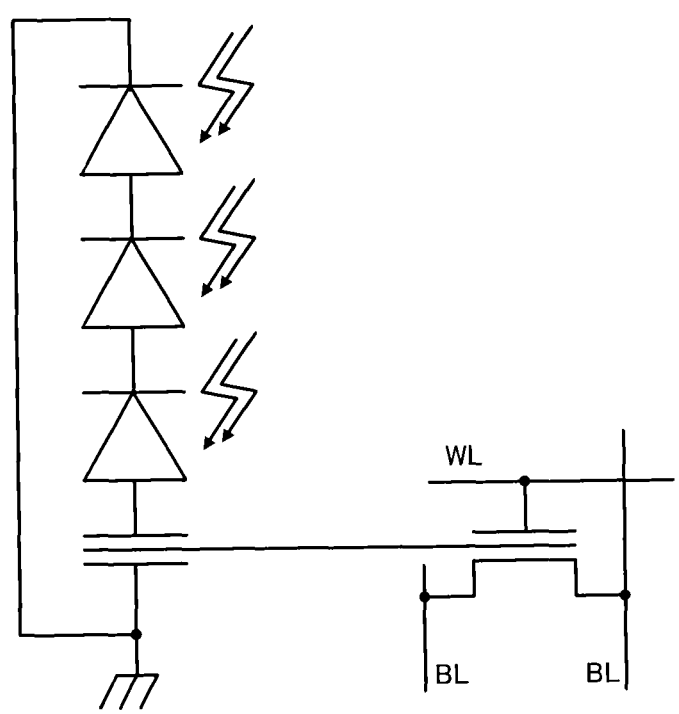
FIG. 4 is an equivalent circuit diagram of a transistor element, a capacitor element, and a photodiode element Di shown in FIG. 2.

An equivalent circuit of the transistor element Tr, the capacitor element Ca, and the photodiode Di which are disposed in the third row shown in FIG. 2 is shown in FIG. 4. Note that WL and BL in FIG. 4 are equivalent to the electrode portions 22 and 23 respectively of FIG. 1 and so on.

(Writing of Optical Signal (Image Signal) in Solid-state Image Capturing Element)

Figure 5:
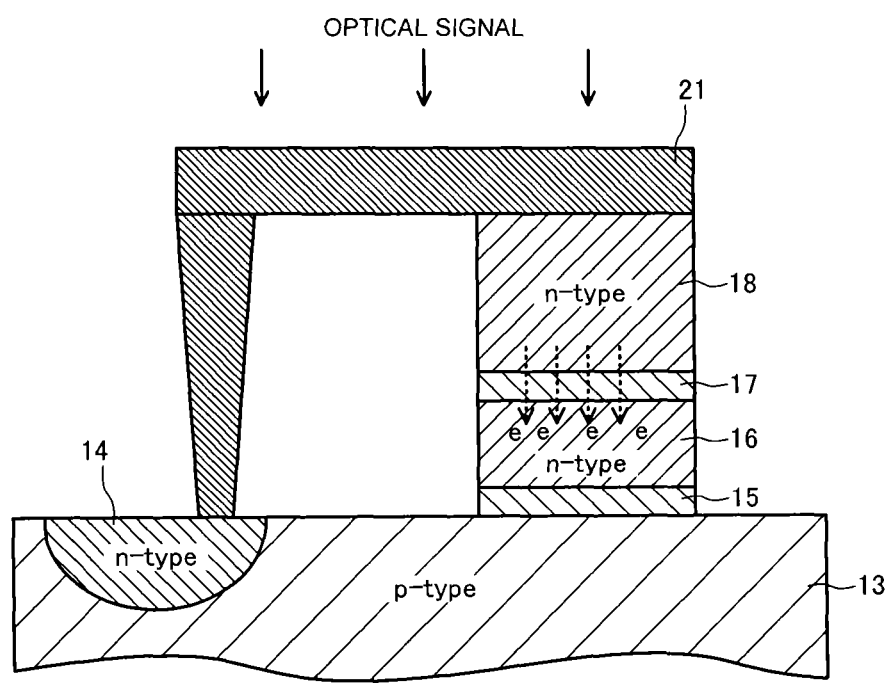
FIG. 5 is a diagram for explaining a writing operation of an optical signal (image signal) in the solid-state image capturing element of the embodiment.
Figure 6A:
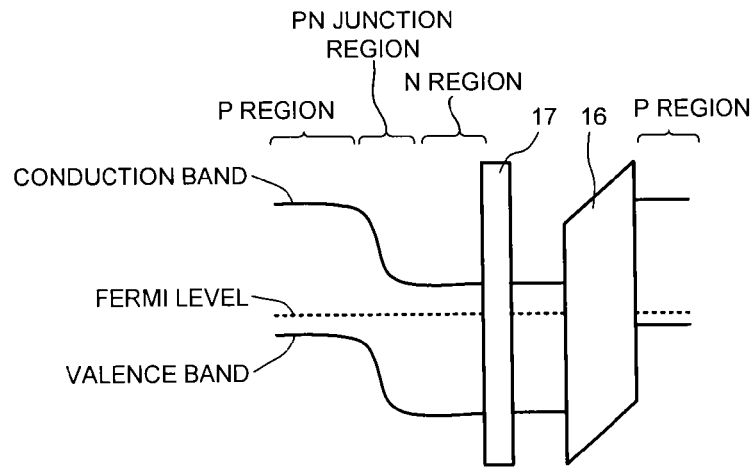
FIG. 6A to FIG. 6C are diagrams showing energy band states of the solid-state image capturing element 10 at a time of the writing operation.
Figure 6B:
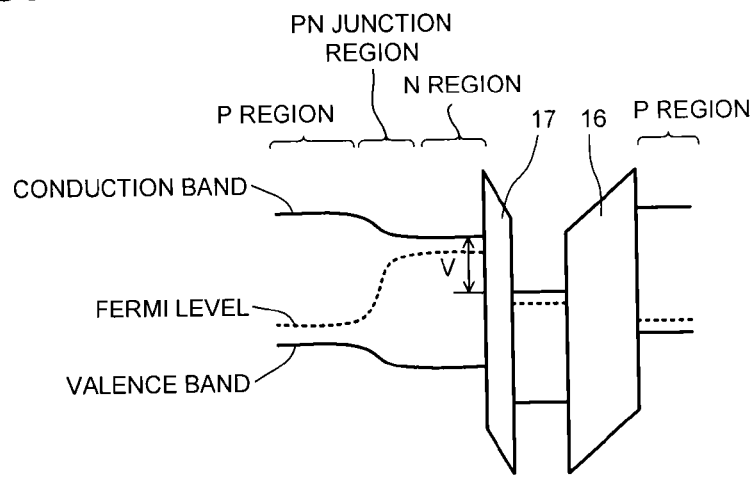
Figure 6C:
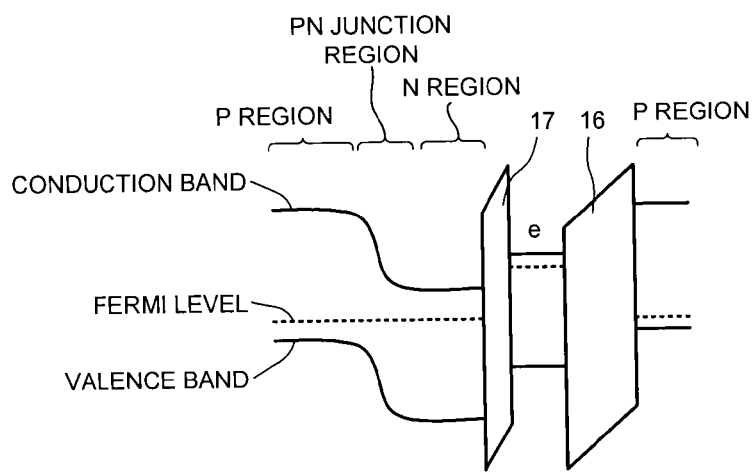

FIG. 5 is a diagram for explaining a writing operation of an optical signal (image signal) into the solid-state image capturing element 10 of this embodiment. FIG. 6A to FIG. 6C are diagrams showing energy band states of the solid-state image capturing element 10 at a time of the writing operation. In the solid-state image capturing element 10 of this embodiment, writing of the optical signal (image signal) is performed into the capacitor element Ca. Thus, in FIG. 5 and FIG. 6A to FIG. 6C, one capacitor element Ca is extracted from the solid-state image capturing element 10 shown in FIG. 1 and so on. The capacitor element Ca is enlargedly illustrated and its energy band state is shown. Note that though a side wall is formed in an actual capacitor element Ca, illustration thereof is omitted in FIG. 5 in view of simplification.

Further, the floating gate 16 and the electrode layer 18 are made up of, for example, n-type polysilicon or the like to exhibit n-type conductivity, respectively.

In FIG. 6A to FIG. 6C, a p region indicates an energy level of the p-type diffusion layer 13. A pn junction region indicates an energy level of the junction region of the p-type diffusion layer 13 and the n-type diffusion layer 14. An n region indicates an energy level of the electrode layer 18 including the first electrode portion 21.

The capacitor element Ca shown in FIG. 5 is in a state indicated in FIG. 6A, before the writing operation. That is, the energy level of then region and the energy level of the floating gate 16 are at the same level.

Next, when an optical signal (image signal) originated in a predetermined image is irradiated to the capacitor element Ca, a carrier electron is generated in the n-type diffusion layer 14 constituting the photodiode element Di. The carrier electron is led to the electrode layer 18 of the capacitor element Ca via the first electrode portion 21 electrically connected to the n-type diffusion layer 14, as an electric signal converted from the aforementioned optical signal.

On this occasion, as shown in FIG. 6B, the energy level of the n region, that is, of the electrode layer 18 is raised. That is, the energy level of the n region becomes higher than the energy level of the floating gate 16 by a degree equivalent to a voltage V, for example. On the other hand, the energy level of the right side of the floating gate 16, that is, of the p region remains the same as in FIG. 6A. Therefore, the energy level of the floating gate 16 becomes lower compared with the energy levels of the n region and the p region. Accordingly, the carrier electron introduced into the electrode layer 18 is introduced into the floating gate 16 and accumulated and stored as an electric signal.

Note that the electrode layer 18 of the capacitor element Ca and the control gate 19 of the transistor element Tr are separate from each other and discontinuous. Therefore, the carrier electron introduced into the electrode layer 18 does not flow from the electrode layer 18 into the control gate 19 of the transistor element Tr. Accordingly, the above-described writing operation into the capacitor element Ca is not hindered by the transistor element Tr which has the floating gate 16 in common.

Note that after the carrier electron is accumulated and stored in the floating gate 16, as shown in FIG. 6C the energy level of the floating gate 16 is raised as a whole.

As described above, in the solid-state image capturing element 10 of this embodiment, only by the optical signal (image signal) being irradiated to the solid-state image capturing element 10, the carrier electron is accumulated and stored as the electric signal in the floating gate 16 of the capacitor element Ca of the solid-state image capturing element 10. Therefore, in the solid-state image capturing element 10 of this embodiment, application of an external voltage is not necessary when storing an electric signal. As a result, a writing operation of an electric signal, that is, an optical signal (image signal), can be simplified, and an external power source is unnecessary to be additionally provided, so that a not-shown overall configuration of the solid-state image capturing element 10 can be simplified.

Writing of the optical signal (image signal) into each capacitor element Ca is performed as described above. In this embodiment, as shown in FIG. 1, the plural photodiode elements Di are connected in series in the second direction (y direction) of the n-type silicon substrate 11, and are electrically connected to the corresponding capacitor elements Ca via the first electrode portion 21. By adopting such a mode, the following advantage can be obtained.

For example, when a signal strength of the optical signal (image signal) irradiated to the solid-sate image capturing element 10 is sufficiently small, a light quantity received by one photodiode element Di is small. Thus, in the capacitor element Ca of the first row in which only a single photodiode element Di is disposed, a quantity of the carrier electrons generated in the n-type diffusion layer 14 is small as explained in association with FIG. 5 and FIG. 6A to FIG. 6C. As a result, sometimes the energy level of the n region, that is, of the electrode layer 18 of the capacitor element Ca is not raised sufficiently. In such a case, the energy level of the n region does not become higher than the energy level of the floating gate 16, and there is a possibility that the carrier electron as the electric signal is not accumulated nor stored in the floating gate 16.

Further, also in the capacitor element Ca of the second row in which two photodiode elements Di are disposed in a manner to be connected in series, a sum of the carrier electrons generated in the n-type diffusion layers 14 of the two photodiode elements Di is introduced into the electrode layer 18 of the relevant capacitor element Ca. A quantity of the sum is still small, and there are cases where, similarly to in the capacitor element Ca of the first row, the energy level of the n region, that is, of the electrode layer 18 of the capacitor element Ca of the second row is not raised sufficiently. In such a case, the energy level of the n region does not become higher than the energy level of the floating gate 16, and there is a possibility that the carrier electron as the electric signal is not accumulated nor stored in the floating gate 16.

However, also in such a case, in the capacitor element of the third row in which three photodiode elements Di are disposed in a manner to be connected in series, a sum of the carrier electrons generated in the n-type diffusion layers 14 of the three photodiode elements Di sometimes reaches an amount of a certain degree. In such a case, by the carrier electron introduced into the electrode layer 18 of the capacitor element Ca, the energy level of the n region, that is, of the electrode layer 18 of the capacitor element Ca is raised sufficiently. The energy level of the n region becomes sufficiently higher than the energy level of the floating gate 16, and the carrier electron as the electric signal is come to be accumulated and stored in the floating gate 16.

In other words, as shown in FIG. 1, the plural photodiode elements Di are connected in series in the second direction (y direction) of the n-type silicon substrate 11, the number of the photodiode elements Di being changed for each row, and are electrically connected to the corresponding capacitor elements Ca via the first electrode portions 21. Thus, even an optical signal with a small signal strength can be converted into an electric signal to be accumulated and stored in the capacitor element Ca. Therefore, a sensitivity to the optical signal (image signal) of the solid-state image capturing element 10 can be improved.

Note that when the strength of the optical signal (image signal) irradiated to the solid-state image capturing element 10 is medium, based on the above-described writing principle, the carrier electron as the electric signal is not accumulated nor stored in the capacitor element Ca of the first row, for example. The carrier electrons as the electrode signals are accumulated and stored only in the capacitor elements Ca of the second row and the third row.

Further, when the strength of the optical signal (image signal) irradiated to the solid-state image capturing element 10 is sufficiently large, based on the above-described writing principle, the carrier electrons as the electric signals are accumulated and stored in all the capacitor elements Ca of the first row to the third row, for example.

Note that in FIG. 5, it is possible to exchange positions of the p-type diffusion layer 13 and the n-type diffusion layer 14 and to electrically connect the first electrode portion 21 to the p-type diffusion layer 13 and the electrode layer 18 of the capacitor element Ca. In this case also, it is possible to perform writing into the capacitor element Ca. In such a case, an electron is accumulated in the floating gate 16 of the capacitor element Ca in advance. As a result that the optical signal (image signal) is irradiated, a carrier hole generated in the p-type diffusion layer 13 is introduced into the electrode layer 18 via the first electrode portion 21. Next, by a potential difference, the electron is taken out from the floating gate 16. As a result, in the floating gate 16, the electron having been accumulated in advance and the carrier hole are coupled, and the number of the electrons accumulated in the floating gate 16 decreases.

In other words, in the above case, by eliminating the electron in the floating gate 16 of the capacitor element Ca, the electric signal originated in the optical signal (image signal) can be accumulated and stored in the floating gate 16.

(Reading and Deleting of Optical Signal (Image Signal) in Solid-state Image Capturing Element)

Next, a method for reading the electric signal originated in the optical signal (image signal) accumulated and stored in the capacitor element Ca of the solid-state image capturing element 10 will be described.

As shown in FIG. 1 and FIG. 2, a counter electrode layer to the electrode layer 18 of the capacitor element Ca in the solid-state image capturing element 10 is constituted by the floating gate 16 extending from the transistor element Tr. Therefore, as a result that the electron is accumulated and stored in the floating gate 16 of the capacitor element Ca, a threshold voltage of the transistor element Tr changes (increases, in this case). Concretely, when the threshold voltage of the transistor element Tr of the first row is Vth1, the threshold voltage of the transistor element Tr of the second row is Vth2, and the threshold voltage of the transistor element Tr of the third row is Vth3, a relation of Vth1>Vth2>Vth3 is approved.

Thus, when a predetermined voltage V is applied to the second electrode portion 22 and a voltage is applied between the adjacent third electrode portions 23 (which are electrically connected to the sources S and the drains D of the transistor elements Tr as necessary), the voltage V applied to the second electrode portion 22 satisfies V>Vth3. When the electric signal originated in the optical signal (image signal) has been accumulated and stored in the capacitor element Ca of the third row, an electric current flows between the source S and the drain 3D of the transistor element Tr of the third row. Thus, by measuring this electric current, the electric signal originated in the optical signal (image signal) accumulated and stored in the capacitor element Ca of the third row can be read.

Further, when the voltage applied to the second electrode portion 22 satisfies V>Vth2 and the electric signal originated in the optical signal (image signal) has been accumulated and stored in the capacitor element Ca of the second row, an electric current flows between the source S and the drain D of the transistor element Tr. Thus, by measuring this electric current, the electric signal originated in the optical signal (image signal) accumulated and stored in the capacitor element Ca of the second row can be read.

Further, when the voltage applied to the second electrode portion 22 satisfies V>Vth1 and the electric signal originated in the optical signal (image signal) has been accumulated and stored in the capacitor element Ca of the first row, an electric current flows between the source S and the drain D of the transistor element Tr. Thus, by measuring this electric current, the electric signal originated in the optical signal (image signal) accumulated and stored in the capacitor element Ca of the first row can be read.

Note that also when positions of the p-type diffusion layer 13 and the n-type diffusion layer 14 are exchanged in FIG. 5 and the electric signal originated in the optical signal (image signal) is accumulated and stored in the capacitor element Ca, the electrons decrease as the strength of the optical signal (image signal) increases. Thus, the above-described relation of the threshold voltages among the transistor elements Tr of respective rows becomes Vth1<Vth2<Vth3, but the method for reading is basically the same as above.

For example, the electric signal originated in the optical signal (image signal) accumulated and stored in the capacitor element Ca of the solid-state image capturing element 10 can be deleted as below. That is, by applying a positive voltage from the second electrode 22 to the control gate 19 of the transistor element Tr, the electric signal (electron) accumulated and stored in the floating gate 16 is pulled out via the second electrode portion 22.

Note that there are cases where the positions of the p-type diffusion layer 13 and the n-type diffusion layer 14 are exchanged and the electric signal originated in the optical signal (image signal) is accumulated and stored in the capacitor element Ca. In such a case, for example, by applying a negative voltage from the second electrode portion 22 to the control gate 19 of the transistor element Tr, a deleting operation can be performed by accumulating the electron in the floating gate 16 in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image capturing element, comprising:
   a semiconductor substrate;
   a photodiode formed on the semiconductor substrate;
   a capacitor formed on the semiconductor substrate and including a first electrode layer, an insulating layer, and a second electrode layer which are stacked in sequence;
   a transistor formed on the semiconductor substrate and including a floating gate and a control gate; and
   a first electrode portion electrically connecting the second electrode layer and an n-type diffusion layer or a p-type diffusion layer constituting the photodiode,
   wherein the first electrode layer of the capacitor is constituted by the floating gate of the transistor; and
   wherein the second electrode layer of the capacitor and the control gate of the transistor are discontinuous.

2. The solid-state image capturing element according to claim 1,
   wherein the photodiode includes a plurality of photodiode elements connected in series; and
   wherein the n-type diffusion layer or the p-type diffusion layer of a photodiode element and the second electrode layer of the capacitor are electrically connected via the first electrode portion.

3. The solid-state image capturing element according to claim 2,
   wherein the transistor includes a plurality of transistor elements arranged in a first direction of the semiconductor substrate;
   wherein the capacitor includes a plurality of capacitor elements arranged to correspond to the plurality of respective transistor elements in the first direction of the semiconductor substrate;
   wherein the first electrode layer of the capacitor element is constituted by the floating gate of the transistor element, between the respective transistor elements and the capacitor elements corresponding to the transistor elements; and
   wherein the control gate of the transistor element and the second electrode layer of the capacitor element are discontinuous.

4. The solid-state image capturing element according to claim 3, wherein the plurality of photodiode elements are arrayed in a second direction orthogonal to the first direction of the semiconductor substrate and the number of the photodiode elements differs for each array.

5. The solid-state image capturing element according to claim 4, comprising
a second electrode portion electrically connecting the plurality of transistor elements respectively along the first direction of the semiconductor substrate.

6. The solid-state image capturing element according to claim 5, comprising
a plurality of third electrode portions electrically connected to the second electrode portion and sources/drains of the plurality of respective transistor elements along the second direction of the semiconductor substrate.

* * * * *